(12) United States Patent
Yano et al.

(10) Patent No.: US 9,357,643 B2
(45) Date of Patent: May 31, 2016

(54) CERAMIC/COPPER CIRCUIT BOARD AND SEMICONDUCTOR DEVICE

(71) Applicants: KABUSHIKI KAISHA TOSHIBA, Tokyo (JP); TOSHIBA MATERIALS CO., LTD., Yokohama-shi, Kanagawa (JP)

(72) Inventors: Keiichi Yano, Yokohama (JP); Hiromasa Kato, Nagareyama (JP); Kimiya Miyashita, Fujisawa (JP); Takayuki Naba, Chigasaki (JP)

(73) Assignees: KABUSHIKI KAISHA TOSHIBA, Tokyo (JP); TOSHIBA MATERIALS CO., LTD., Yokohama-shi (JP)

( * ) Notice: Subject to any disclaimer, the term of this patent is extended or adjusted under 35 U.S.C. 154(b) by 100 days.

(21) Appl. No.: 14/305,779

(22) Filed: Jun. 16, 2014

(65) Prior Publication Data

US 2014/0291699 A1 Oct. 2, 2014

Related U.S. Application Data

(63) Continuation of application No. PCT/JP2012/008178, filed on Dec. 20, 2012.

(30) Foreign Application Priority Data

Dec. 20, 2011 (JP) ................................. 2011-278945

(51) Int. Cl.
*H05K 1/00* (2006.01)
*H05K 1/09* (2006.01)
(Continued)

(52) U.S. Cl.
CPC ................ *H05K 1/09* (2013.01); *C04B 37/026* (2013.01); *H01L 23/3735* (2013.01);
(Continued)

(58) Field of Classification Search
CPC ............. H05K 1/03; H05K 1/16; H03K 3/06; H03K 3/20; H03K 3/38; H01L 21/44; H01L 23/12; H01L 23/15
USPC .......... 174/250, 252, 255, 260; 428/209, 210, 428/469, 620, 621; 257/341, 615, 735; 438/611, 622, 639; 363/37; 29/847
See application file for complete search history.

(56) References Cited

U.S. PATENT DOCUMENTS 4,657,825 A * 4/1987 Kanda et al. .................. 428/627
5,098,494 A * 3/1992 Reisman ..................... 156/89.16

(Continued)

FOREIGN PATENT DOCUMENTS

EP 0 963 966 A1 12/1999
EP 2 480 052 A1 7/2012

(Continued)

*Primary Examiner* — Xiaoliang Chen
(74) *Attorney, Agent, or Firm* — Foley & Lardner LLP

(57) ABSTRACT

A ceramic/copper circuit board of an embodiment includes a ceramic substrate and first and second copper plates bonded to surfaces of the ceramic substrate via bonding layers containing active metal elements. In cross sections of end portions of the first and second copper plates, a ratio (C/D) of an area C in relation to an area D is from 0.2 to 0.6. The area C is a cross section area of a portion protruded toward an outer side direction of the copper plate from a line AB, and the area D is a cross section area of a portion corresponding to a right-angled triangle whose hypotenuse is the line AB. R-shape sections are provided at edges of upper surfaces of the first and second copper plates, and lengths F of the R-shape sections are 100 μm or less.

14 Claims, 3 Drawing Sheets

(51) Int. Cl.
*C04B 37/02* (2006.01)
*H05K 1/03* (2006.01)
*H05K 3/38* (2006.01)
*H01L 23/373* (2006.01)
*H01L 29/16* (2006.01)

(52) U.S. Cl.
CPC ......... *H01L 29/1608* (2013.01); *H05K 1/0306* (2013.01); *H05K 3/38* (2013.01); *C04B 2235/96* (2013.01); *C04B 2235/9607* (2013.01); *C04B 2237/125* (2013.01); *C04B 2237/126* (2013.01); *C04B 2237/127* (2013.01); *C04B 2237/343* (2013.01); *C04B 2237/366* (2013.01); *C04B 2237/368* (2013.01); *C04B 2237/407* (2013.01); *C04B 2237/704* (2013.01); *C04B 2237/706* (2013.01); *C04B 2237/708* (2013.01); *C04B 2237/86* (2013.01); *C04B 2237/88* (2013.01); *H01L 2924/0002* (2013.01); *H05K 2201/098* (2013.01); *H05K 2201/09827* (2013.01); *Y10T 428/24488* (2015.01)

(56) References Cited

U.S. PATENT DOCUMENTS

| | | | | |
|---|---|---|---|---|
| 5,328,751 A * | 7/1994 | Komorita et al. | | 428/209 |
| 5,672,848 A * | 9/1997 | Komorita et al. | | 174/260 |
| 5,807,626 A * | 9/1998 | Naba | | 428/210 |
| 6,232,657 B1 * | 5/2001 | Komorita et al. | | 257/700 |
| 6,242,374 B1 | 6/2001 | Komatsu | | |
| 6,284,985 B1 * | 9/2001 | Naba et al. | | 174/260 |
| 6,426,154 B1 * | 7/2002 | Naba et al. | | 428/620 |
| 6,569,514 B2 * | 5/2003 | Naba et al. | | 428/210 |
| 6,576,982 B1 * | 6/2003 | You et al. | | 257/639 |
| 6,577,009 B1 * | 6/2003 | You et al. | | 257/751 |
| 6,586,842 B1 * | 7/2003 | You et al. | | 257/774 |
| 6,613,443 B2 * | 9/2003 | Komatsu et al. | | 428/469 |
| 6,663,787 B1 * | 12/2003 | You et al. | | 216/18 |
| 6,677,679 B1 * | 1/2004 | You et al. | | 257/758 |
| 6,689,684 B1 * | 2/2004 | You et al. | | 438/639 |
| 6,756,672 B1 * | 6/2004 | You et al. | | 257/751 |
| 6,790,758 B2 * | 9/2004 | Hsieh et al. | | 438/612 |
| 7,038,320 B1 * | 5/2006 | You et al. | | 257/774 |
| 7,482,685 B2 * | 1/2009 | Fukuda et al. | | 257/703 |
| 8,273,993 B2 * | 9/2012 | Kato et al. | | 174/260 |
| 8,415,791 B2 * | 4/2013 | Tsukada et al. | | 257/735 |
| 8,518,554 B2 * | 8/2013 | Naba et al. | | 428/621 |
| 2003/0141948 A1 * | 7/2003 | Maekawa et al. | | 333/204 |
| 2003/0232494 A1 * | 12/2003 | Adams et al. | | 438/622 |
| 2004/0102028 A1 * | 5/2004 | Hsieh et al. | | 438/611 |
| 2005/0258484 A1 * | 11/2005 | Itou | | 257/341 |
| 2009/0056996 A1 * | 3/2009 | Kato et al. | | 174/260 |
| 2009/0278233 A1 * | 11/2009 | Pinnington et al. | | 257/615 |
| 2009/0315061 A1 * | 12/2009 | Andrews | | 257/99 |
| 2011/0075451 A1 * | 3/2011 | Bayerer et al. | | 363/37 |
| 2012/0168209 A1 * | 7/2012 | Kato | | 174/255 |

FOREIGN PATENT DOCUMENTS

| | | |
|---|---|---|
| EP | 2480052 A1 * | 7/2012 |
| JP | 05-304350 A | 11/1993 |
| JP | 10-004156 A | 1/1998 |
| JP | 11-340598 A | 12/1999 |
| JP | 2002-232090 A | 8/2002 |
| JP | 2004-172182 A | 6/2004 |
| JP | 2004-314161 A | 11/2004 |
| JP | 4346151 B2 | 7/2009 |
| JP | 2011-091184 A | 5/2011 |
| JP | 2011-199315 A | 10/2011 |
| WO | WO 2011/034075 A1 | 3/2011 |
| WO | WO 2011034075 A1 * | 3/2011 |

* cited by examiner

CERAMIC/COPPER CIRCUIT BOARD AND SEMICONDUCTOR DEVICE

CROSS-REFERENCE TO RELATED APPLICATIONS

This application is a continuation of prior International Application No. PCT/JP2012/008178 filed on Dec. 20, 2012, which is based upon and claims the benefit of priority from Japanese Patent Application No. 2011-278945 filed on Dec. 20, 2011; the entire contents of all of which are incorporated herein by reference.

FIELD

Embodiments described herein relate generally to a ceramic/copper circuit board and a semiconductor device using the same.

BACKGROUND ART

For a circuit board for power module, there is conventionally used a bonded substrate made by bonding a ceramic substrate such as an inexpensive aluminum oxide substrate, a highly thermally conductive aluminum nitride substrate, a highly strong silicon nitride substrate, and a metal plate such as a copper plate having a large thermal conductivity by a high melting point metal method using molybdenum (Mo) or tungsten (W), a DBC (Direct Bonding Copper) method using a eutectic reaction of copper and oxygen, an active metal bonding method using an active metal such as titanium (Ti), or the like. A circuit board is configured as a result of patterning the metal plate having been bonded to the ceramic substrate, by means of etching, for example. Among various bonding methods, the active metal bonding method is commonly used since a bonding strength can be heightened.

When a semiconductor device is to be configured by using a ceramic circuit board, a semiconductor chip is mounted on a metal plate such as a copper plate via a solder layer. As one of characteristics demanded of the ceramic circuit board, there can be cited a thermal cycle test (TCT) characteristic. The TCT is a test in which a ceramic circuit board is held for a predetermined period under circumstances of a low temperature, a room temperature, and a high temperature and it is investigated what degree of durability against such thermal change the ceramic circuit board has.

In order to improve the TCT characteristic of the ceramic circuit board, a structure is suggested in which a brazing material layer is protruded from an end portion of a copper plate. In a ceramic/copper circuit board having such a structure, when a TCT one cycle of which is −40° C.×30 minutes→room temperature×10 minutes→125° C.×30 minutes→room temperature×10 minutes is carried out, it is reported that a crack does not occur in a ceramic substrate even after 30 cycles. As a semiconductor chip comes to have a higher power, there is required a ceramic/copper circuit board in which a crack does not occur in a ceramic substrate at a 1000 cycle level in TCT characteristic.

Further, there is suggested a ceramic/copper circuit board whose TCT characteristic is improved by using a silicon nitride substrate as a ceramic substrate and controlling a composition of a brazing material protruded from an end portion of a copper plate. In such a ceramic/copper circuit board, when TCT is carried out under a severer condition of −50° C.×30 minutes→room temperature×10 minutes→155° C.×30 minutes→room temperature×10 minutes being one cycle, it is reported that a crack does not occur in the ceramic substrate at a 5000 cycle level.

A semiconductor chip is being made to have a higher power. Under such a circumstance, it is estimated that an operation temperature of a Si element, which has conventionally been about 100 to 130° C., rises to about 160 to 190° C. Further, it is estimated that an operation temperature of a SiC element becomes as high as 200 to 250° C. In order to cope with the semiconductor chip coming to have a higher power and the operation temperature coming to be higher as above, improvement of TCT characteristic under a severer condition is required of a ceramic/copper circuit board.

As described above, TCT characteristic is improved by using a silicon nitride substrate as a ceramic substrate. On the other hand, a durability of only about 300 to 400 cycles is obtained in a case of an aluminum nitride substrate or an aluminum oxide substrate. The silicon nitride substrate can be strengthened to 600 MPa or more in a three-point bending strength. Though the TCT characteristic can be improved by using the silicon nitride substrate as above, the silicon nitride substrate is generally more expensive compared with the aluminum nitride substrate and the aluminum oxide substrate, and thus a manufacturing cost of a ceramic/copper circuit board is increased. Thus, a ceramic/copper circuit board capable of improving TCT characteristic even in a case of using an aluminum nitride substrate or an aluminum oxide substrate is required.

When a semiconductor chip is to be mounted on a ceramic/copper circuit board, a bonder-mounter device is commonly used. In such a device, a surface of a copper plate is image-recognized to detect a position, the semiconductor chip is positioned in relation to the copper plate whose position has been detected, and thereafter, the semiconductor chip is mounted on the copper plate. Position detection of the copper plate is performed by detecting a position of an end portion of the copper plate by using a detector such as a CCD camera. When a composition of a brazing material protruded from the end portion of the copper plate is controlled in order to improve TCT characteristic, the end portion of the copper plate becomes a gentle inclined surface. With such a gentle inclined surface, a defect such as reduction of a detection accuracy of the copper plate end portion by the detector occurs. If the gentle inclined surface is formed in the copper plate end portion, an area in which the semiconductor chip can be mounted becomes smaller in relation to an area of the copper plate. Thus, constraint on design of a semiconductor becomes large.

DETAILED DESCRIPTION

According to one embodiment, there is provided a ceramic/copper circuit board including: a ceramic substrate having a first surface and a second surface; a first copper plate bonded to the first surface of the ceramic substrate via a first bonding layer containing at least one active metal element selected from the group consisting of titanium (Ti), zirconium (Zr), hafnium (Hf), aluminum (Al), and niobium (Nb) and at least one element selected from the group consisting of silver (Ag), copper (Cu), tin (Sn), indium (In), and carbon (C); and a second copper plate bonded to the second surface of the ceramic substrate via a second bonding layer containing at least one active metal element selected from the group consisting of titanium (Ti), zirconium (Zr), hafnium (Hf), aluminum (Al), and niobium (Nb) and at least one element selected from the group consisting of silver (Ag), copper (Cu), tin (Sn), indium (In), and carbon (C). In cross sections of the end portions of the first and second copper plates, each of the end portions of the first and second copper plates has a shape in which a ratio (C/D) of an area C in relation to an area D is from 0.2 to 0.6. The area C is a cross section area of a portion protruded from a line AB toward an outer side direction of the copper plate, the area D is a cross section area of a portion corresponding to a right-angled triangle whose hypotenuse is the line AB, the line AB is a straight line connecting a point A and a point B, the point A is a bonding edge of the copper plate and the ceramic substrate, and the point B is a point where a straight line drawn from the point A toward an inner side of an upper surface of the copper plate in a direction of 45° in relation to an interface of the copper plate and the ceramic substrate intersects with the upper surface of the copper plate. Further, R-shape sections are provided at edges of the upper surfaces of the first and second copper plates corresponding to a corner portion of the area C, and each of lengths F of the R-shape sections viewed from the above of the first and second copper plates is 100 μm or less.

Figure 1:
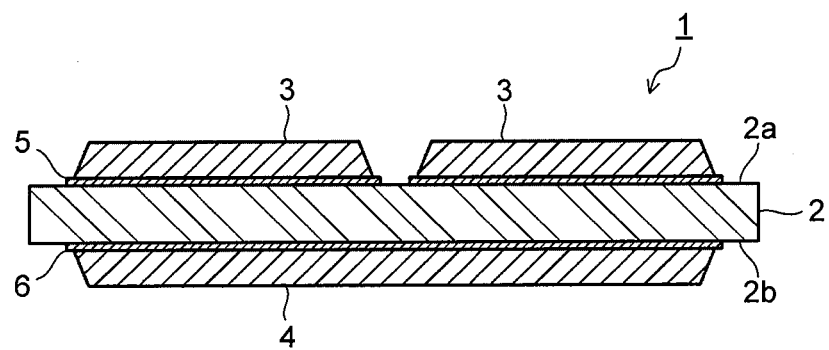
FIG. 1 is a cross-sectional view showing a ceramic/copper circuit board of an embodiment.

Hereinafter, a ceramic/copper circuit board of an embodiment and a semiconductor device using the same will be described with reference to the drawings. FIG. 1 is a cross-sectional view showing a configuration of the ceramic/copper circuit board of the embodiment. In FIG. 1, a reference numeral 1 indicates the ceramic/copper circuit board, a reference numeral 2 indicates a ceramic substrate, a reference numeral 3 indicates a copper circuit board (first copper plate), and a reference numeral 4 indicates a rear side copper plate (second copper plate). FIG. 1 shows an example in which two copper plates as the copper circuit board 3 are bonded to the ceramic substrate 2, but the configuration of the ceramic/copper circuit board of the embodiment is not limited thereto. The number of the copper circuit board 3 can be increased/decreased properly. FIG. 1 shows an example in which one copper plate as the rear side copper plate 4 is bonded to the ceramic substrate 2, but the configuration of the ceramic/copper circuit board of the embodiment is not limited thereto. The second copper plate is not limited to the rear side copper plate 4 used for mounting or heat release, but can be a copper circuit board.

In the ceramic/copper circuit board 1 of the embodiment, to a first surface 2a of the ceramic substrate 2 is bonded the copper circuit board (first copper plate) 3 via a first bonding layer 5. To a second surface 2b of the ceramic substrate 2 is bonded the rear side copper plate (second copper plate) 4 via a second bonding layer 6. The first and second bonding layers 5, 6 contain at least one active metal element selected from titanium (Ti), zirconium (Zr), hafnium (Hf), aluminum (Al), and niobium (Nb), and at least one element selected from silver (Ag), copper (Cu), tin (Sn), indium (In), and carbon (C). The ceramic/copper circuit board 1 is configured by bonding the copper plates 3, 4 to both surfaces 2a, 2b of the ceramic substrate 2 by the active metal bonding method.

The active metal bonding method is a method for bonding ceramic substrate 2 and copper plates 3,4 by using an active metal brazing material containing at least one active metal element selected from Ti, Zr, Hf, Al, and Nb and at least one element selected from Ag, Cu, Sn, In, and C. It is preferable that the active metal brazing material contains, with a sum of the active metal elements, Ag, Cu, Sn, In, and C being 100 mass %, 1 to 6 mass % of active metal element, 50 to 80 mass % of Ag, 15 to 30 mass % of Cu, 15 mass % or less (including zero) of Sn, 15 mass % or less (including zero) of In, and 2 mass % or less (including zero) of carbon. By using the active metal brazing material having such a composition, components of the bonding layers 5, 6 can be controlled.

It is preferable, further, that the active metal brazing material contains the active metal element, Ag, Cu, and at least one element selected from Sn, In, and C. It is preferable that a content of at least one element selected from Sn, In, and C is in a range of 1 to 15 mass %. The active metal element is a component which improves a bonding strength of the ceramic substrate 2 and the copper plates 3, 4 by forming a reaction phase as a result of reacting with the ceramic substrate 2. In a case where Ti is used as the active metal element, a Ti oxide phase is formed if the ceramic substrate 2 is an aluminum oxide substrate. A Ti nitride phase is formed if a silicon nitride substrate or an aluminum nitride substrate is used as the ceramic substrate 2. Among the active metal elements, Ti and Zr are easy to form a reaction phase with the ceramic substrate 2, and are preferably used. In particular, it is preferable to use Ti.

A combination of Ag and Cu generates a eutectic crystal. As a result that the eutectic crystal of Ag and Cu is formed, the bonding layers 5, 6 are strengthened. Further, as a result that at least one selected from Sn, In, and C is contained, a thermal expansion coefficient and a flexibility of the bonding layers 5, 6 can be controlled. A crack occurring in the ceramic substrate 2 on TCT of the ceramic/copper circuit board 1 is caused by a stress due to a thermal expansion difference between the ceramic substrate 2 and the copper plates 3, 4. In order to alleviate the thermal expansion difference, it is preferable that the thermal expansion coefficients of the bonding layers 5, 6 are adjusted to be values between those of the ceramic substrate 2 and the copper plates 3, 4. Sn, In, and C are components which do not hamper generation of the Ag—Cu eutectic crystal and are effective for adjustment of the thermal expansion coefficient. Further, as a result that at least one selected from Sn, In, and C is contained, flexibilities of the bonding layers 5, 6 can be heightened. By heightening the flexibilities of the bonding layers 5, 6, it is possible to absorb a deformation stress at a time that the copper plates 3, 4 thermally expand at the TCT.

The ceramic/copper circuit board 1 of the embodiment, in cross-sectional observation of end portions of the copper plates 3, 4, has an end portion shape described below. In cross sections of the end portions of the copper plates 3, 4, when a bonding edge between the copper plate and the ceramic substrate is a point A, a point where a straight line drawn from the point A toward an inner side of an upper surface of the copper plate in a direction of 45° in relation to an interface of the copper plate and the ceramic substrate intersects with the copper plate upper surface is a point B, a straight line connecting the point A and the point B is a line AB, a cross section area of a portion protruded from the line AB toward an outer side direction of the copper plate is an area C, and a cross section area of a portion corresponding to a right-angled triangle whose hypotenuse is the line AB is an area D, each of the first and second copper plates 3, 4 has a shape in which a ratio (C/D) of the area C in relation to the area D is from 0.2 to 0.6. Further, R-shape sections are provided at edges of the upper surfaces of the first and second copper plates 3, 4 corresponding to corner portions of the area C, and each of lengths F of the R-shape sections viewed from the above of the first and second copper plates 3, 4 are 100 μm or less.

Figure 2:
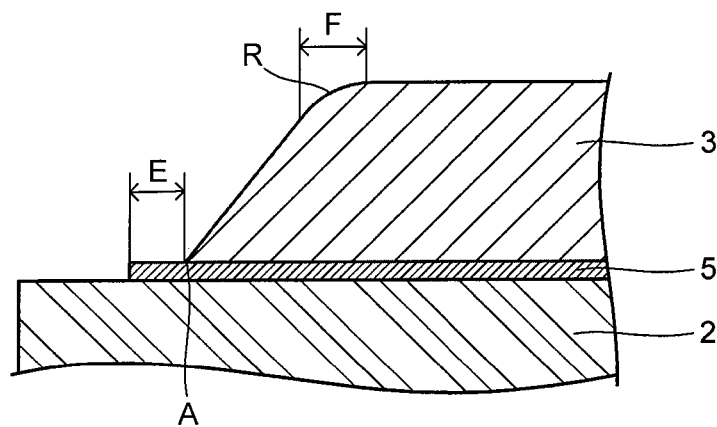
FIG. 2 is a cross-sectional view showing a structure of an end portion of a copper plate in the ceramic/copper circuit board of the embodiment.
Figure 3:
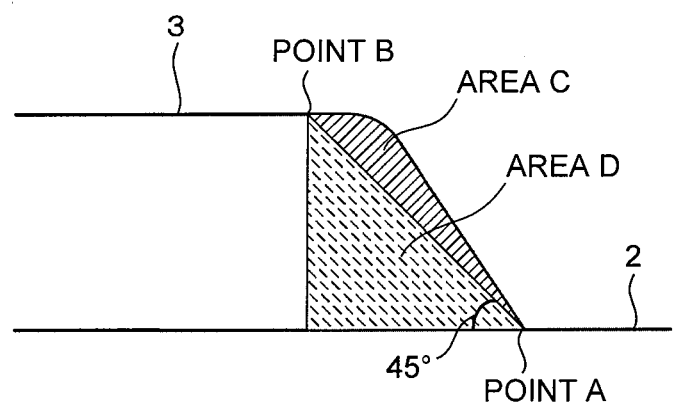
FIG. 3 is a diagram for explaining a shape of the end portion of the copper plate in the ceramic/copper circuit board of the embodiment.

FIG. 2 and FIG. 3 show the end portion shapes of the copper plates 3, 4 in the ceramic/copper circuit board 1 of the embodiment. With reference to FIG. 2 and FIG. 3, the point A, the point B, the straight line AB, the area C, the area D, a length E, and the length F will be described. First, a cross section of an end portion of an arbitrary copper plate is observed. The observed cross section is a cross section in a thickness direction of the copper plate. FIG. 2 and FIG. 3 mainly show the end portion of the copper circuit board (first copper plate) 3. An end portion of the rear side copper plate (second copper plate) 4 also has a shape similar to that of the copper circuit board (first copper plate) 3. The end portion shape described below is a shape of end portions of the copper circuit board (first copper plate) 3 and the rear side copper plate (second copper plate) 4.

As shown in FIG. 3, the point A is a bonding edge of the copper plate 3 and the ceramic substrate 2. Note that the bonding layer 5 is not shown in FIG. 3. A straight line is drawn from the point A toward the inner side of the upper surface of the copper plate 3 in the direction of 45° in relation to the interface of the copper plate 3 and the ceramic substrate 2, and the point where the straight line intersects with the upper surface of the copper plate 3 is the point B. The cross section area of the portion protruded from the line AB connecting the point A and the point B toward the outer side direction of the copper plate 2 is the area C, and the cross section area of the portion corresponding to the right-angled triangle whose hypotenuse is the line AB is the area D. The copper plate 3 (4) in the embodiment has the end portion shape in which the ratio (C/D) of the area C in relation to the area D is from 0.2 to 0.6.

When the area ratio C/D is in a range of 0.2 to 0.6, an appropriate inclined surface is formed in the end portion of the copper plate 3 (4). Formation of the appropriate inclined surface in the end portion of the copper plate 3 (4) alleviates a stress (stress caused by a thermal expansion difference) generated in the end portion of the copper plate 3 (4) in TCT of the ceramic/copper circuit board 1. Therefore, TCT characteristic of the ceramic/copper circuit board 1 can be improved. When the area ratio (C/D) is less than 0.2, a mounting area of a semiconductor chip of the copper plate 3 (4) becomes small. When the area ratio (C/D) exceeds 0.6, an alleviation effect of the stress caused by the thermal expansion difference cannot be obtained. It is more preferable that the area ratio (C/D) is in a range of 0.3 to 0.5. The reason why the straight line of 45° in relation to the interface is adopted as a standard of the area D is that a 45° heat release simulation of the ceramic/copper circuit board is made a premise.

As shown in FIG. 2, the R-shape section is provided in the edge of the upper surface of the copper plate 3 (4). The edge of the upper surface of the copper plate 3 (4) corresponds to the corner portion of the area C. The R-shape section has the shape where the length F of the R-shape section viewed from the above of the copper plate 3 (4) is 100 μm or less. The length F being 100 μm or less means that the R-shape section has a shape with a small curvature radius. When the length F is 100 μm or less, an accuracy of position detection of the copper plate 3 (4) to which image recognition is applied is improved. If the length F exceeds 100 μm, an R shape becomes gentle, and an accuracy varies at a time that the edge of the copper plate 3 (4) is detected by applying image recognition. Positioning in a bonder-mounter device or the like is carried out by image-recognizing the copper plate 3 (4) by using a detector such as a CCD camera. Unless the edge of the copper plate 3 (4) can be image-recognized accurately, the positioning accuracy of the copper plate 3 (4) is reduced, and based thereon, a positioning accuracy of a mounting place of the semiconductor chip is deteriorated.

In fabricating a semiconductor device by mounting a semiconductor chip on a ceramic/copper circuit board 1, there is a possibility that electrical connection to the semiconductor chip cannot be accurately done if displacement occurs in a mounting position of the semiconductor chip. Further, in some cases, the semiconductor device itself becomes defective. A mounting process step of the semiconductor chip is mechanized by the bonder-mounter device or the like. Thus, if the mounting position of the semiconductor chip cannot be recognized accurately by a machine, the semiconductor device becomes a defective product. By providing the R-shape section as described above in the upper surface edge of the copper plate 3 (4), the edge of the copper plate 3 can be detected with a high accuracy by using image recognition. It is preferable that the length F is 50 μm or less. However, when the length F is too short, stress concentration becomes easy to occur, and thus the length F is preferable to be 10 μm or more, and further, is more preferable to be 20 μm or more.

Figure 4:
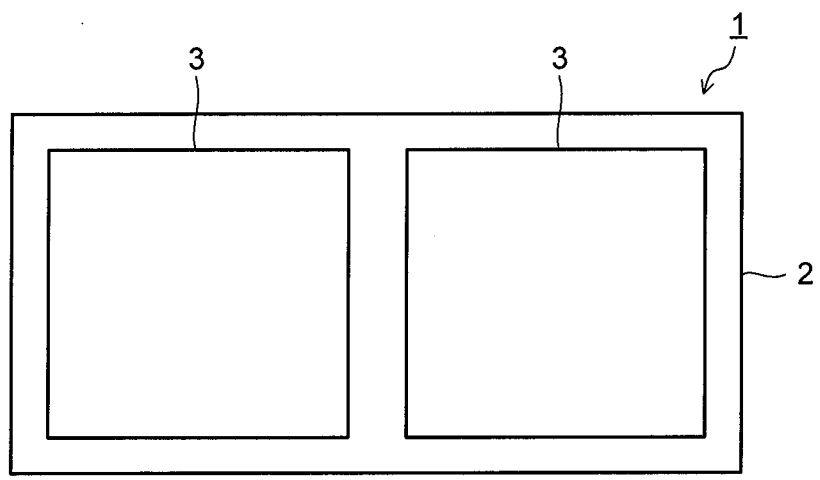
FIG. 4 is a plan view viewed from a first copper plate side of the ceramic/copper circuit board of the embodiment.
Figure 5:
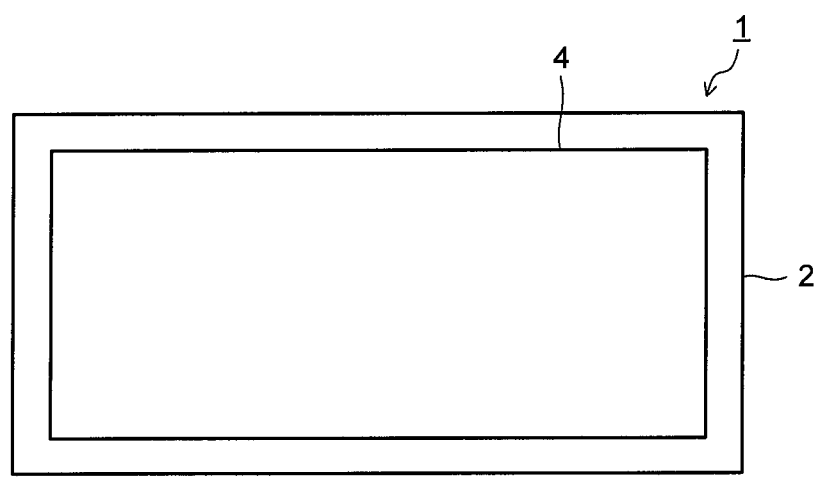
FIG. 5 is a rear view viewed from a second copper plate side of the ceramic/copper circuit board of the embodiment.

FIG. 4 is a plan view of the ceramic/copper circuit board 1 viewed from a copper circuit board 3 side, and FIG. 5 is a rear view of the ceramic/copper circuit board 1 viewed form a rear side copper plate 4 side. The semiconductor chip (not shown) is mounted on a part of the copper circuit board 3 shown in FIG. 4. The mounting position of the semiconductor chip is recognized based on a distance from an edge of the copper circuit board 3 having been detected by means of image recognition. Thus, it is necessary that the edge of the copper circuit board 3 has a shape easy to be image-recognized. The copper circuit board 3 in the embodiment has an R shape with a length F of 100 μm or less as a shape where the edge is easy to be image-recognized. Note that the semiconductor chip is not shown in FIG. 4. The semiconductor device of this embodiment is configured by mounting the semiconductor chip in a part of the copper circuit board 3.

In the first and second bonding layers 5, 6, it is preferable that a content of the active metal element per a forming area of 10 $mm^2$ of the bonding layer is in a range of from 0.5 mg to 0.8 mg. As described above, the active metal element reacts with the ceramic substrate 2 to form a reaction phase. If the content of the active metal element per the forming area of 10 $mm^2$ of the bonding layers 5, 6 is less than 0.5 mg (milligram), an amount of the active metal element is insufficient and a bonding strength is reduced. On the other hand, the content of the active metal element exceeding 0.8 mg does not lead to an even better effect, and further, causes an increase of a manufacturing cost of the ceramic/copper circuit board 1. The content of the active metal element per the forming area of 10 $mm^2$ of the bonding layers 5, 6 can be adjusted by a content of the active metal element in an active metal brazing material and a thickness of a coating layer of the active metal brazing material, for example.

Further, it is preferable that the bonding layers 5, 6 are protruded from the end portions of the copper plates 3, 4. It is preferable that lengths E of the bonding layers 5, 6 protruded from the end portions of the copper plates 3, 4 are from 10 μm to 150 μm. The protruded lengths E of the bonding layers 5, 6 are, as shown in FIG. 2, widths of the bonding layers 5, 6 protruded from the points A toward the outer side. According to the bonding layers 5, 6 with the protruded lengths E of 10 μm or more, stresses generated in the end portions of the copper plates 3, 4 can be alleviated. However, the protruded length E exceeding 150 μm does not lead to an even better effect, and further, an insulation performance with the adjacent copper plate not being able to be secured, may cause a short circuit between the copper plates. It is more preferable that the protruded length E is from 10 μm to 100 μm. In some cases, the bonding layers 5, 6 are not necessarily required to be protruded from the end portions of the copper plates 3, 4.

It is preferable that the ceramic substrate 2 is a silicon nitride substrate made of a silicon nitride sintered body, an aluminum nitride substrate made of an aluminum nitride sintered body, or an aluminum oxide substrate made of an aluminum oxide sintered body. The silicon nitride substrate has strength as high as 600 MPa or more in a three-point bending strength, as a material. The aluminum nitride substrate has a thermal conductiveness as high as 170 W/m·K in a thermal conductivity. The aluminum oxide substrate is inexpensive. The ceramic substrate 2 is selected according to an object, based on advantages of the above substrates. With regard to the silicon nitride substrate, as described in Patent Publication U.S. Pat. No. 4,346,151, one with a three-point bending strength of 700 MPa or more and a thermal conductivity of 80 W/m·K is being developed. A silicon nitride substrate with a high strength and a high thermal conductivity can heighten a heat release performance and can also improve TCT characteristic.

It is preferable that a thickness of the ceramic substrate 2 is in a range of 0.2 to 1 mm. It is preferable that thicknesses of the copper plates 3, 4 are in a range of 0.1 to 1 mm. If the thickness of the ceramic substrate 2 is less than 0.2 mm, there is a possibility that strength is reduced and that TCT characteristic is also reduced. If the ceramic substrate 2 is thin, an insulation performance cannot be secured, and there is a possibility that a leak current occurs. The ceramic substrate 2 whose thickness exceeds 1 mm becomes a thermal register, and there is a possibility that a heat release performance is reduced. If the thicknesses of the copper plates 3, 4 are less than 0.1 mm, a current density as a circuit is reduced. Strengths as the copper plates 3, 4 is also reduced. If the thicknesses of the copper plates 3, 4 exceed 1 mm, the current density is improved, but there is a possibility that TCT characteristic is reduced since a deformation amount due to thermal expansion becomes large. It is more preferable that the thicknesses of the copper plates 3, 4 are in a range of 0.2 to 0.6 mm.

According to this embodiment, the TCT characteristic of the ceramic/copper circuit board 1 can be substantially improved. The TCT is an endurance test in which, with one cycle being a low temperature region→a room temperature→a high temperature region→a room temperature, such a cycle is repeatedly applied to a ceramic/copper circuit board 1 to investigate a crack of the ceramic substrate 2 and the number of cycles where a problem such as peeling of the copper plates 3, 4 occurs. The ceramic/copper circuit board 1 has a characteristic that a crack does not occur in the ceramic substrate 2 even after 1000 cycles in TCT whose one cycle is −40° C.×30 minutes→room temperature (25° C.)×10 minutes→175° C.×30 minutes→room temperature (25° C.)× 10 minutes. Further, the same applies also to TCT whose one cycle is −50° C.×30 minutes→room temperature (25° C.)→10 minutes→250° C.×30 minutes→room temperature (25° C.)×10 minutes.

In a conventional TCT, a maximum temperature (high temperature region) is 125° C. or 150° C., for example. In contrast, the ceramic/copper circuit board 1 of the embodiment has an excellent characteristic that a crack does not occur in a ceramic substrate even after 1000 cycles of TCT in which a maximum temperature (high temperature region) is 170° C. or more. Concrete TCT conditions are described above. In other words, even under severer conditions of TCT in which a temperature difference between a low temperature region and a high temperature region is 210° C. or more, and further, of TCT in which a temperature difference is 300° C., the ceramic/copper circuit board 1 of the embodiment exhibits an excellent characteristic.

According to such a ceramic/copper circuit board 1 as above, it is possible to substantially improve a reliability of a semiconductor device configured by mounting a semiconductor chip on a copper circuit board 3. Therefore, even if an operation temperature becomes 170° C. due to power increase of a Si element, a reliability of the ceramic/copper circuit board 1 can be maintained. Similarly, also in a case where a semiconductor chip with an operation temperature of 200 to 250° C. such as a SiC element is mounted, TCT characteristic of the ceramic/copper circuit board 1 can be maintained. In other words, the ceramic/copper circuit board 1 is effective as a circuit board for mounting a semiconductor chip with an operation temperature of 170° C. or more.

Next, a method for manufacturing the ceramic/copper circuit board 1 will be described. It suffices that the ceramic/copper circuit board 1 of the embodiment has the aforementioned structure and the method for manufacturing the same is not limited in particular. As the method for obtaining the ceramic/copper circuit board 1 of the embodiment efficiently, there can be cited a manufacturing method described below.

First, a ceramic substrate 2 is prepared. An active metal brazing material paste is prepared. A ratio of active metal elements, Ag, Cu, Sn, In, and C in the active metal brazing material is as described above. The active metal brazing material paste is applied onto the ceramic substrate 2. It is preferable that an application thickness of the active metal brazing material paste is in a range of 10 to 40 μm. If the application thickness is less than 10 μm, there is a possibility that a bonding strength is reduced. A function as a thermal stress alleviating layer of the bonding layers 5, 6 is also reduced. The application thickness exceeding 40 μm does not lead to an even better effect and causes an increase of a manufacturing cost of the ceramic/copper circuit board 1.

Next, a copper plate 3 is disposed on an application region of the active metal brazing material paste. On this occasion, the active metal brazing material paste is applied also on a rear surface of the ceramic substrate 2, and copper plates 3, 4 are disposed on the both surfaces. It is preferable that the copper plates 3, 4 are oxygen-free copper plates. The copper plates 3, 4 can be ones which have been processed to circuit pattern shapes in advance or can be ones with vertical and horizontal sizes as those of the ceramic substrate 2. Next, heating is performed to bond the ceramic substrate 2 and the copper plates 3, 4. It is preferable that heating is performed in vacuum or in an inert gas atmosphere such as a nitrogen gas. It is preferable that a heating condition is 700 to 900° C.×10 to 120 minutes. If a heating temperature is lower than 700° C. or a heating time is shorter than 10 minutes, a reaction phase of the active metal element and the ceramic substrate 2 is not formed sufficiently, which leads to a possibility that a bonding strength is reduced. If the heating temperature exceeds 900° C. or the heating time exceeds 120 minutes, excessive thermal deformation applied to the copper plates 3, 4 causes a defect to occur.

The copper plates 3, 4 are subjected to etching as necessary, for the sake of formation of circuit patterns, for example. Edge portion shapes of the copper plates 3, 4 can be obtained by bonding the copper plates 3, 4 whose edge portions are processed to object shapes in advance to the ceramic substrate 2, or can be obtained by etching the copper plates 3, 4 to have object shapes, after bonding. When etching is applied, the end portion shapes of the copper plates 3, 4 can be adjusted by strongness and weakness of etching conditions or the like. For adjustment of protruded lengths E of bonding layers 5, 6, it is effective to use masking or the like described in International Publication No. 2011/034075, for example.

Next, concrete examples and evaluation results thereof will be described.

Example 1 to 11

Comparative Examples 1 to 9

As ceramic substrates, there are prepared a silicon nitride substrate (thermal conductivity: 90 W/m·K, three-point bending strength: 730 MPa) with a plate thickness of 0.635 mm, an aluminum nitride substrate (thermal conductivity: 180 W/m·K, three-point bending strength: 400 MPa) with a plate thickness of 0.635 mm, and an aluminum oxide substrate (thermal conductivity: 15 W/m·K, three-point bending strength: 500 MPa) with a plate thickness of 0.635 mm. Shapes of the ceramic substrates are standardized at 50 mm vertically×30 mm horizontally.

Next, an active metal brazing material whose composition is shown in Table 1 is prepared, made into a paste state, and applied onto the ceramic substrate. An application thickness of the active metal brazing material paste is shown in Table 1. Next, there is prepared a copper plate (oxygen-free copper plate) with a plate thickness of 0.3 mm. A shape of the copper plates is standardized at 45 mm vertically×25 mm horizontally. In examples 1 to 9, the copper plates with the plate thickness of 0.3 mm are used. In the examples 10 and 11, the copper plates with the plate thickness of 0.5 mm are used. The copper plate is disposed on the printed active metal brazing material paste.

By heating the ceramic substrate on which the copper plates are disposed in vacuum under a condition of 800 to 840° C.×20 to 40 minutes, the copper plates are bonded onto both surfaces of the ceramic substrates. By etching the copper plate of a front surface side by using a $FeCl_3$ etching solution, two circuit patterns shown in FIG. 4 are formed. The circuit patterns are in a structure where two patterns of 20 mm vertically×20 mm horizontally are formed at 2 mm interval. Further, by changing etching conditions variously, an end portion of the copper plate is processed to have a shape fulfilling a condition shown in Table 2. The end portion shape of the copper plate shown in FIG. 2 is provided in both of the copper circuit board and the rear side copper plate.

TABLE 1

| | Substrate | Active metal brazing material [mass %] | | | | | | Brazing material thickness [μm] | Ti content [mg/cm²] |
| --- | --- | --- | --- | --- | --- | --- | --- | --- | --- |
| | | Ag | Cu | Sn | In | Ti | C | | |
| E1 | $Si_3N_4$ | 69.0 | 26.9 | — | — | 4 | — | 15 | 0.8 |
| E2 | $Si_3N_4$ | 61.8 | 24.1 | 10 | — | 4 | — | 15 | 0.7 |
| E3 | $Si_3N_4$ | 61.1 | 23.8 | 10 | — | 4 | 1.0 | 15 | 0.6 |
| E4 | $Si_3N_4$ | 61.1 | 23.8 | — | 10 | 4 | 1.0 | 15 | 0.6 |
| E5 | $Si_3N_4$ | 61.1 | 23.8 | 10 | — | 4 | 1.0 | 12 | 0.5 |
| E6 | $Si_3N_4$ | 61.1 | 23.8 | 10 | — | 4 | 1.0 | 12 | 0.5 |
| E7 | $Si_3N_4$ | 61.1 | 23.8 | 10 | — | 4 | 1.0 | 12 | 0.5 |
| E8 | AlN | 61.1 | 23.8 | 10 | — | 4 | 1.0 | 12 | 0.5 |
| E9 | $Si_3N_4$ | 58.3 | 22.7 | 10 | — | 8 | 1.0 | 10 | 0.8 |
| E10 | $Si_3N_4$ | 58.3 | 22.7 | 10 | — | 8 | 1.0 | 10 | 0.8 |
| E11 | $Al_2O_3$ | 58.3 | 22.7 | 10 | — | 8 | 1.0 | 10 | 0.8 |
| CE1 | AlN | 69.1 | 26.9 | — | — | 4 | — | 15 | 0.8 |
| CE2 | AlN | 61.8 | 24.1 | 10 | — | 4 | — | 15 | 0.7 |
| CE3 | AlN | 61.1 | 23.8 | 10 | — | 4 | 1.0 | 15 | 0.6 |
| CE4 | AlN | 58.3 | 22.7 | 10 | — | 8 | 1.0 | 15 | 1.2 |
| CE5 | AlN | 58.3 | 22.7 | 10 | — | 2 | 1.0 | 15 | 0.3 |
| CE6 | AlN | 58.3 | 22.7 | 10 | — | 8 | 1.0 | 15 | 1.2 |
| CE7 | $Si_3N_4$ | 58.3 | 22.7 | 10 | — | 8 | 1.0 | 15 | 1.2 |
| CE8 | AlN | 61.1 | 23.8 | 10 | — | 4 | 1.0 | 12 | 0.5 |

E1 to E11 = Example 1 to Example 11;
CE1 to CE8 = Comparative Example 1 to Comparative Example 8

TABLE 2

| | Area C [mm²] | Area ratio C/D | Length E [μm] | Length F [μm] |
| --- | --- | --- | --- | --- |
| Example 1 | 0.015 | 0.33 | 80 | 30 |
| Example 2 | 0.015 | 0.33 | 80 | 20 |
| Example 3 | 0.015 | 0.33 | 80 | 25 |
| Example 4 | 0.015 | 0.33 | 80 | 23 |
| Example 5 | 0.015 | 0.33 | 80 | 30 |
| Example 6 | 0.025 | 0.55 | 80 | 20 |
| Example 7 | 0.015 | 0.33 | 10 | 25 |
| Example 8 | 0.015 | 0.33 | 10 | 18 |
| Example 9 | 0.015 | 0.33 | 10 | 38 |
| Example 10 | 0.020 | 0.44 | 50 | 40 |
| Example 11 | 0.020 | 0.44 | 50 | 40 |
| Comparative Example 1 | 0.036 | 0.80 | 80 | 25 |
| Comparative Example 2 | 0.036 | 0.80 | 80 | 23 |
| Comparative Example 3 | 0.036 | 0.80 | −20 | 30 |
| Comparative Example 4 | 0.036 | 0.80 | 50 | 20 |
| Comparative Example 5 | 0.036 | 0.80 | 50 | 25 |
| Comparative Example 6 | 0.007 | 0.16 | 50 | 18 |
| Comparative Example 7 | 0.007 | 0.16 | 50 | 38 |
| Comparative Example 8 | 0.015 | 0.33 | 10 | 105 |

For ceramic/copper circuit boards of the examples 1 to 11 and the comparative examples 1 to 8, there are investigated a bonding strength of the copper plate, a withstand voltage defective percentage, TCT characteristic, and a positioning accuracy by image recognition. The bonding strength is measured by a peeling strength. The withstand voltage defective percentage is evaluated by an occurrence percentage (%) of a penetration defect at a time of application of a voltage of 10 kV×1 minute between front and rear copper plates with N=20. The withstand voltage defective percentage means that as a value thereof is low a defect is hard to occur.

The TCT characteristic is evaluated by three conditions described below. A condition 1 is that one cycle is −40° C.×30 minutes→room temperature (25° C.)×10 minutes→125° C.×30 minutes→room temperature (25° C.)×10 minutes. A condition 2 is that one cycle is −40° C.×30 minutes→room temperature (25° C.)×10 minutes→175° C.×30 minutes→room temperature (25° C.)×10 minutes. A condition 3 is that one cycle is −50° C.×30 minutes→room temperature (25° C.)×10 minutes→250° C.×30 minutes→room temperature (25° C.)×10 minutes. Existence/absence of a crack after 1000 cycles in the ceramic substrate is investigated with a normality η (%). The normality η (%) is obtained by investigating a ratio of cracks formed in a bonding edge periphery of the copper plate of the ceramic/copper circuit board. With a periphery length of the bonding edge of the copper plate being assumed 100%, a ratio where a crack does not occur is measured. The normality η (%) of 100% means that one in which a crack occurs does not exist. A normality η (%) of 0% means that cracks occur in the periphery lengths of the end portions of all the copper plates. In a TCT, a value of a sample with the largest normality η (%) is indicated, with a sample number being N=20.

For the positioning accuracy by image recognition, whether or not a semiconductor chip can be mounted on an object position by a bonder-mounter device is investigated. One in which a positional displacement does not occur is indicated as "A" and one in which a positional displacement occurs is indicated as "B". A result thereof is shown in Table 3.

TABLE 3

| | Bonding strength [kN/m] | Withstand voltage defective percentage [%] | TCT characteristic | | | Positioning accuracy |
|---|---|---|---|---|---|---|
| | | | Condition 1 | Condition 2 | Condition 3 | |
| E1 | 15 | 0 | 100 | 100 | 100 | A |
| E2 | 18 | 0 | 100 | 100 | 100 | A |
| E3 | 16 | 0 | 100 | 100 | 100 | A |
| E4 | 16 | 0 | 100 | 100 | 100 | A |
| E5 | 17 | 0 | 100 | 100 | 100 | A |
| E6 | 16 | 0 | 100 | 100 | 100 | A |
| E7 | 18 | 0 | 100 | 100 | 100 | A |
| E8 | 15 | 0 | 100 | 100 | 100 | A |
| E9 | 20 | 0 | 100 | 100 | 100 | A |
| E10 | 18 | 0 | 100 | 100 | 100 | A |
| E11 | 15 | 0 | 100 | 100 | 100 | A |
| CE1 | 15 | 0 | 10 | 0 | 0 | A |
| CE2 | 18 | 0 | 30 | 0 | 0 | A |
| CE3 | 14 | 0 | 0 | 0 | 0 | A |
| CE4 | 12 | 0 | 10 | 0 | 0 | A |
| CE5 | 8 | 0 | 0 | 0 | 0 | A |
| CE6 | 14 | 30 | 100 | 0 | 0 | A |
| CE7 | 14 | 30 | 100 | 100 | 50 | A |
| CE8 | 15 | 10 | 100 | 0 | 0 | B |

E1 to E11 = Example 1 to Example 11;
CE1 to CE8 = Comparative Example 1 to Comparative Example 8

As known from Table 3, the ceramic/copper circuit boards of the examples each have the excellent TCT characteristic. The positional displacement by the bonder-mounter device (of image recognition type by a CCD camera) does not occur, either. Further, since the end portion shape of the copper plate is improved, it is possible to secure a broader mounting area of the semiconductor chip on the copper circuit board.

Examples 12, 13

An example 12 is the ceramic copper substrate of the example 9, and an example 13 is a ceramic copper substrate whose copper plate thickness is changed to 0.5 mm from the example 9. For the ceramic/copper circuit boards of the example 12 and the example 13, TCT's are carried out under the condition 2 (one cycle: −40° C.×30 minutes→room temperature (25° C.)×10 minutes→175° C.×30 minutes→room temperature (25° C.)×10 minutes), and the number of cycles where a crack occurs in the ceramic substrate is investigated. A result thereof is shown in Table 4.

TABLE 4

| | Cycle number where crack occurs in ceramic substrate |
|---|---|
| Example 12 | 6300 |
| Example 13 | 6100 |

As is known from Table 4, the ceramic/copper circuit boards of the examples have durabilities of 6000 cycles or more even in the TCT's whose maximum temperatures exceed 170° C.

Examples 14 to 18

As ceramic substrates, ones described below are prepared. A ceramic substrate 1 is a silicon nitride substrate (thermal conductivity: 93 W/m·K, three-point bending strength: 700 MPa) with a plate thickness of 0.320 mm. A ceramic substrate 2 is a silicon nitride substrate (thermal conductivity: 100 W/m·K, three-point bending strength: 600 MPa) with a plate thickness of 0.320 mm. A ceramic substrate 3 is an aluminum nitride substrate (thermal conductivity: 200 W/m·K, three-point bending strength: 320 MPa) with a plate thickness of 0.635 mm. A ceramic substrate 4 is an aluminum oxide substrate (thermal conductivity: 12 W/m·K, three-point bending strength: 400 MPa) with a plate thickness of 0.635 mm. Note that shapes of the ceramic substrates are standardized at 50 mm vertically×30 mm horizontally.

Next, an active metal brazing material whose composition is shown in Table 5 is prepared, made to a paste state, and printed and applied onto the ceramic substrate. A copper plate of 45 mm vertically×20 mm horizontally×0.3 mm in thickness is prepared. The copper plate is disposed on a coating layer of the active metal brazing material paste. By heating the ceramic substrate on which the copper plates are disposed in vacuum under a condition of 800 to 840° C.×20 to 40 minutes, the copper plates are bonded on both surfaces of the ceramic substrate. By etching the copper plate of a front surface side by using a $FeCl_3$ etching solution, two circuit patterns shown in FIG. 4 are formed. The circuit patterns are in a structure where two patterns of 20 mm vertically×20 mm horizontally are formed at 2 mm interval. Next, by changing etching conditions variously, an end portion of the copper plate is processed to have a shape fulfilling a condition shown in Table 6. The end portion shape of the copper plate shown in FIG. 6 is provided in both of the copper circuit board and the rear side copper plate.

TABLE 5

| | Substrate | Active metal brazing material [mass %] | | | | | | Brazing material thickness [μm] | Ti content [mg/cm$^2$] |
|---|---|---|---|---|---|---|---|---|---|
| | | Ag | Cu | Sn | In | Ti | C | | |
| Example 14 | Substrate 1 | 58.3 | 22.7 | 10 | — | 8 | 1.0 | 10 | 0.8 |
| Example 15 | Substrate 1 | 61.8 | 24.1 | 10 | — | 4 | — | 15 | 0.7 |

TABLE 5-continued

| | Substrate | Active metal brazing material [mass %] | | | | | | Brazing material thickness [μm] | Ti content [mg/cm²] |
|---|---|---|---|---|---|---|---|---|---|
| | | Ag | Cu | Sn | In | Ti | C | | |
| Example 16 | Substrate 2 | 61.1 | 23.8 | 10 | — | 4 | 1.0 | 15 | 0.6 |
| Example 17 | Substrate 3 | 61.1 | 23.8 | 10 | — | 4 | 1.0 | 15 | 0.6 |
| Example 18 | Substrate 4 | 61.1 | 23.8 | 10 | — | 4 | 1.0 | 15 | 0.6 |

TABLE 6

| | Area C [mm²] | Area ratio C/D | Length E [μm] | Length F [μm] |
|---|---|---|---|---|
| Example 14 | 0.013 | 0.30 | 100 | 90 |
| Example 15 | 0.023 | 0.50 | 20 | 30 |
| Example 16 | 0.018 | 0.40 | 130 | 50 |
| Example 17 | 0.009 | 0.20 | 50 | 70 |
| Example 18 | 0.027 | 0.60 | 50 | 70 |

For the ceramic/copper circuit boards of the examples 14 to 18, a bonding strength, a withstand voltage defective percentage, a TCT characteristic (condition 1, condition 2, condition 3), and a positioning accuracy are measured by a similar method to that in the example 1. A result thereof is shown in Table 7. As is known from Table 7, it is confirmed that the ceramic/copper circuit boards of the examples each have the excellent characteristic.

TABLE 7

| | Bonding strength [kN/m] | Withstand voltage defective percentage [%] | TCT characteristic | | | Positioning accuracy |
|---|---|---|---|---|---|---|
| | | | Condition 1 | Condition 2 | Condition 3 | |
| Example 14 | 19 | 0 | 100 | 100 | 100 | A |
| Example 15 | 19 | 0 | 100 | 100 | 100 | A |
| Example 16 | 18 | 0 | 100 | 100 | 100 | A |
| Example 17 | 17 | 0 | 100 | 100 | 92 | A |
| Example 18 | 17 | 0 | 100 | 100 | 98 | A |

Next, a TCT under the condition 2 (one cycle: −40° C.×30 minutes→room temperature (25° C.)×10 minutes→175° C.×30 minutes→room temperature (25° C.)×10 minutes) is carried out and the number of cycles where a crack occurs in the ceramic substrate is investigated. A result thereof is shown in Table 8.

TABLE 8

| | Cycle number where crack occurs in ceramic substrate |
|---|---|
| Example 14 | 6600 |
| Example 15 | 6200 |
| Example 16 | 5830 |
| Example 17 | 1400 |
| Example 18 | 1500 |

As is known from Table 8, the examples 14 to 16 in which the silicon nitride substrates are used each have a durability of 5000 cycles or more. Durabilities of the example 17 using the aluminum nitride substrate and of the example 18 using the aluminum oxide substrate are about 1400 to 1500 cycles, which is inferior to those of the examples 14 to 16, but it is confirmed that the example 17 and the example 18 have superior TCT characteristics compared with the ceramic/copper circuit board using conventional aluminum nitride substrate and aluminum oxide substrate. It is known from the results of the examples 14 to 18 that the TCT characteristic of ceramic/copper circuit board is further improved by using the silicon nitride substrate.

While certain embodiments have been described, these embodiments have been presented by way of example only, and are not intended to limit the scope of the inventions. Indeed, the novel embodiment described herein may be embodiment in a variety of other forms; furthermore, substitutions and changes in the form of the embodiments described herein may be made without departing from the spirit of the inventions. The accompanying claims and their equivalents are intended to cover s.

What is claimed is:

1. A ceramic/copper circuit board comprising:
   a ceramic substrate having a first surface and a second surface;
   a first copper plate bonded to the first surface of the ceramic substrate via a first bonding layer containing at least one active metal element selected from the group consisting of titanium (Ti), zirconium (Zr), hafnium (Hf), aluminum (Al), and niobium (Nb) and at least one element selected from the group consisting of silver (Ag), copper (Cu), tin (Sn), indium (In), and carbon (C); and
   a second copper plate bonded to the second surface of the ceramic substrate via a second bonding layer containing at least one active metal element selected from the group consisting of titanium (Ti), zirconium (Zr), hafnium (Hf), aluminum (Al), and niobium (Nb) and at least one element selected from the group consisting of silver (Ag), copper (Cu), tin (Sn), indium (In), and carbon (C),
   wherein each of end portions of the first and second copper plates has a shape in which a ratio (C/D) of an area C in relation to an area D is from 0.2 to 0.6, wherein in cross sections of the end portions of the first and second copper plates, a point A is a bonding edge of the copper plate and the ceramic substrate, a point B is a point where a straight line drawn from the point A toward an inner side of an upper surface of the copper plate in a direction of 45° in relation to an interface of the copper plate and the ceramic substrate intersects with the upper surface of the copper plate, a line AB is a straight line connecting the point A and the point B, the area C is a cross section area of a portion protruded from the line AB toward an outer side direction of the copper plate, and the area D is a cross section area of a portion corresponding to a right-angled triangle whose hypotenuse is the line AB,
wherein R-shape sections are provided at edges of the upper surfaces of the first and second copper plates corresponding to a corner portion of the area C, and each of lengths F of the R-shape sections viewed from the above of the first and second copper plates is 10 μm or more and 100 μm or less, and
wherein end portions of the first and second bonding layers are protruded from the end portions of the first and second copper plates, respectively, and each of lengths E of the end portions of the first and second bonding layers protruded from the end portions of the first and second copper plates is from 10 μm to 150 μm.

2. The ceramic/copper circuit board according to claim 1, wherein a content of the active metal elements per each of forming areas of 10 mm² of the first and second bonding layers is in a range of from 0.5 mg to 0.8 mg.

3. The ceramic/copper circuit board according to claim 1, wherein each of the first and second bonding layers contains the active metal element, silver (Ag), copper (Cu), and at least one element selected from the group consisting of tin (Sn), indium (In), and carbon (C).

4. The ceramic/copper circuit board according to claim 1, wherein each of the first and second bonding layers contains the active metal element, silver (Ag), copper (Cu), tin (Sn), and carbon (C).

5. The ceramic/copper circuit board according to claim 1, wherein the ceramic substrate is a silicon nitride substrate, an aluminum nitride substrate, or an aluminum oxide substrate.

6. The ceramic/copper circuit board according to claim 1, wherein a thickness of the ceramic substrate is from 0.2 mm to 1 mm.

7. The ceramic/copper circuit board according to claim 1, wherein each of thicknesses of the first and second copper plates is from 0.1 mm to 1 mm.

8. The ceramic/copper circuit board according to claim 1, wherein a crack does not occur in the ceramic substrate when 1000 cycles of thermal cycle tests in which a maximum temperature is 170° C. or more are performed to the ceramic/copper circuit board.

9. The ceramic/copper circuit board according to claim 8, wherein the thermal cycle test is performed with one cycle being −40° C.×30 minutes→room temperature (25° C.)×10 minutes→175° C.×30 minutes→room temperature (25° C.)×10 minutes.

10. A semiconductor device, comprising:
a ceramic/copper circuit board according to claim 1; and
a semiconductor chip mounted on the first copper plate of the ceramic/copper circuit board.

11. The semiconductor device according to claim 10, wherein the semiconductor chip comprises a SiC element.

12. The ceramic/copper circuit board according to claim 1, wherein the ratio (C/D) of the area C in relation to the area D is from 0.3 to 0.5.

13. The ceramic/copper circuit board according to claim 1, wherein each of the lengths E is from 10 μm to 100 μm.

14. The ceramic/copper circuit board according to claim 1, wherein each of the lengths F is 10 μm or more and 50 μm or less.

* * * * *